United States Patent
Singh et al.

(10) Patent No.: US 10,356,926 B1
(45) Date of Patent: Jul. 16, 2019

(54) ELECTRONIC ASSEMBLY WITH ENHANCED HIGH POWER DENSITY

(71) Applicant: Deere & Company, Moline, IL (US)

(72) Inventors: Brij N. Singh, West Fargo, ND (US); Thomas J. Roan, Fargo, ND (US); Michael J. Zurn, Pelican Rapids, MN (US); Brad G. Palmer, Fargo, ND (US); Robert K. Kinyanjui, West Fargo, ND (US); Jeff K. Hansen, Moorhead, MN (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 15/922,202

(22) Filed: Mar. 15, 2018

Related U.S. Application Data

(60) Provisional application No. 62/610,990, filed on Dec. 28, 2017.

(51) Int. Cl.
| | |
|---|---|
| H05K 1/02 | (2006.01) |
| H05K 1/14 | (2006.01) |
| H05K 7/14 | (2006.01) |
| H05K 1/18 | (2006.01) |
| H02M 7/00 | (2006.01) |
| H05K 1/11 | (2006.01) |

(52) U.S. Cl.
CPC .......... *H05K 7/1422* (2013.01); *H02M 7/003* (2013.01); *H05K 1/0203* (2013.01); *H05K 1/0272* (2013.01); *H05K 1/111* (2013.01); *H05K 1/144* (2013.01); *H05K 1/181* (2013.01); *H05K 2201/10189* (2013.01)

(58) Field of Classification Search
CPC . H05K 1/02; H05K 1/14; H05K 1/111; H05K 1/144; H05K 1/181; H05K 1/203; H05K 1/204; H05K 1/272
USPC .................. 361/736, 788; 174/252, 254, 260
See application file for complete search history.

(56) References Cited

U.S. PATENT DOCUMENTS

| | | | | |
|---|---|---|---|---|
| 5,648,892 A | * | 7/1997 | Wieloch | H02M 7/003 361/707 |
| 5,670,749 A | * | 9/1997 | Wieloch | H05K 1/0204 174/252 |
| 2018/0218969 A1 | * | 8/2018 | Nakamura | H01L 23/3135 |

* cited by examiner

*Primary Examiner* — Xiaoliang Chen

(57) ABSTRACT

An electronic assembly comprises a gate drive module comprising multiple circuit board layers sandwiched together, where each layer has a central opening that is aligned with the other layers. A switching circuit chipset is positioned in the central opening. The switching circuit chipset has lead frames for providing electrical connections to the switching circuit chipset. The lead frames are alignable with pockets in two or more of the layers to facilitate alignment of the contact portions of the lead frames with corresponding conductive pads on the circuit board.

17 Claims, 9 Drawing Sheets

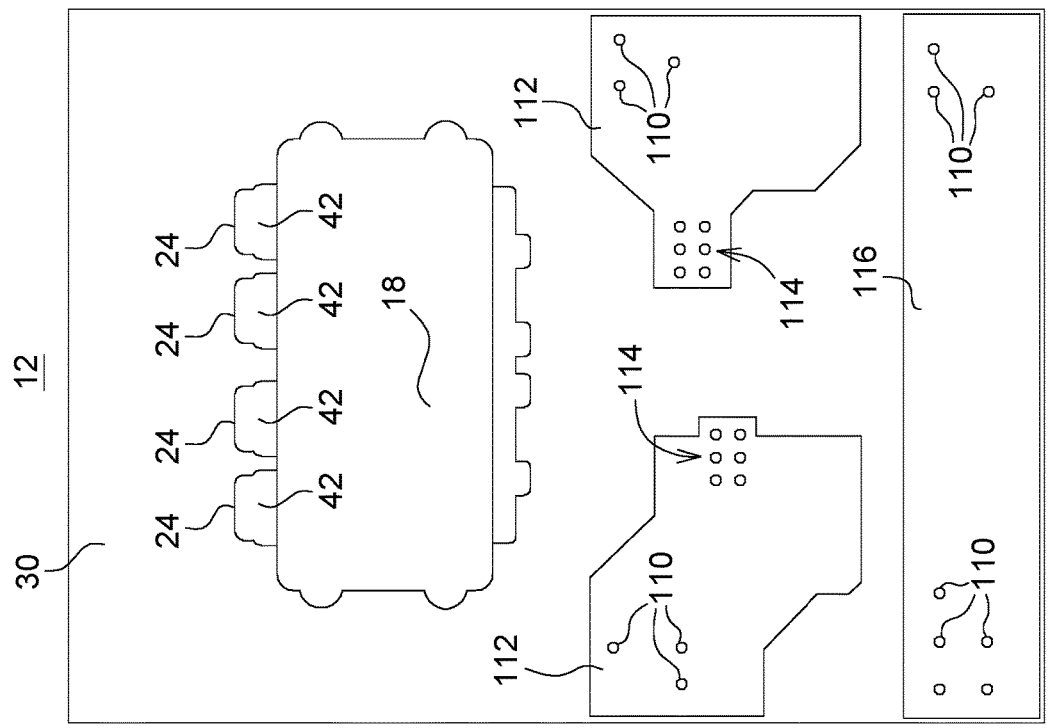
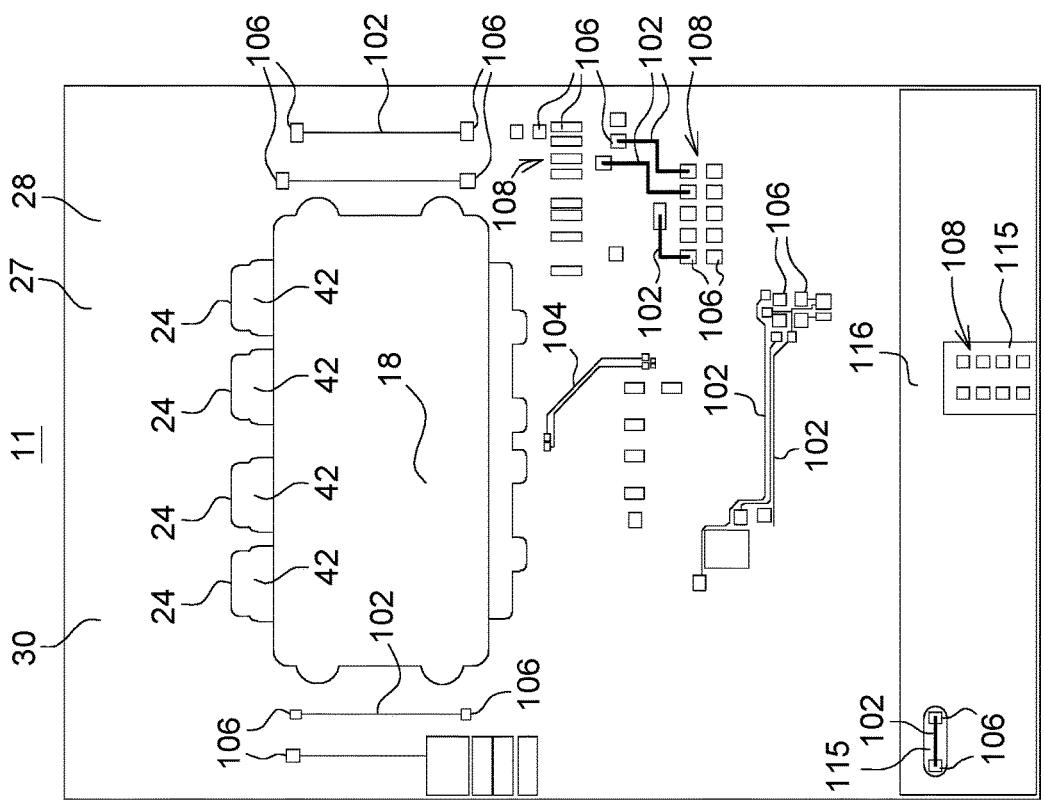

ELECTRONIC ASSEMBLY WITH ENHANCED HIGH POWER DENSITY

RELATED APPLICATION

This application claims the benefit of the filing date of and priority to U.S. Provisional Application Ser. No. 62/610,990, filed Dec. 28, 2017, which is incorporated herein by reference in its entirety.

FIELD

This disclosure relates to an electronic assembly with enhanced high power density.

BACKGROUND

Electronic assemblies, such as inverters or converters are used in conjunction with motors, generators, or electric machines on vehicles. In some prior art, inverters are designed and manufactured with discrete components, such as discrete power switching transistors that tends to increase spatial requirements or the size of a housing or enclosure. In other prior art, inverter driver modules may require ribbon cables or circuit board to circuit board connections that can degrade reliability or occupy additional space of a housing or enclosure. At the time of writing this document, typical semiconductors in power electronic chipsets use 25 micron to 50 micron diameter aluminum or copper bond wires as interconnects from one semiconductor device to another for parallel and series connections of active semiconductor material within power electronic chipset or module. However, conductive bond-wires support limited maximum current density of the semiconductor chipset. Moreover, conductive bond wires are susceptible to thermal issues because bond-wires don't facilitate any direct thermal management (e.g., heat dissipation) of these interconnects. Thus there is need for an electronic assembly with enhanced high power density.

SUMMARY

In accordance with one embodiment, an electronic assembly comprises a gate drive module comprising multiple circuit board layers sandwiched together, where each layer has a central opening that is aligned with the other layers. A switching circuit chipset is positioned in the central opening. The switching circuit chipset has lead frames for providing electrical connections to the switching circuit chipset. The lead frames are alignable or aligned with pockets in two or more of the layers to facilitate alignment of the contact portions of the lead frames with corresponding conductive pads on an outer layer of the circuit board. A set of direct current traces on an outer circuit board layer for supplying direct current to the switching circuit chipset. An output trace on the outer circuit board layer for outputting an alternating current phase output signal.

BRIEF DESCRIPTION OF THE DRAWINGS

FIG. 1A is a plan view of at top layer or first layer of a circuit board in accordance with one embodiment.

FIG. 1B is a plan view of an inner layer or second layer of a circuit board in accordance with one embodiment.

Like reference numbers in any set of two or more drawings indicate like features or elements.

DETAILED DESCRIPTION

Figure 1C:
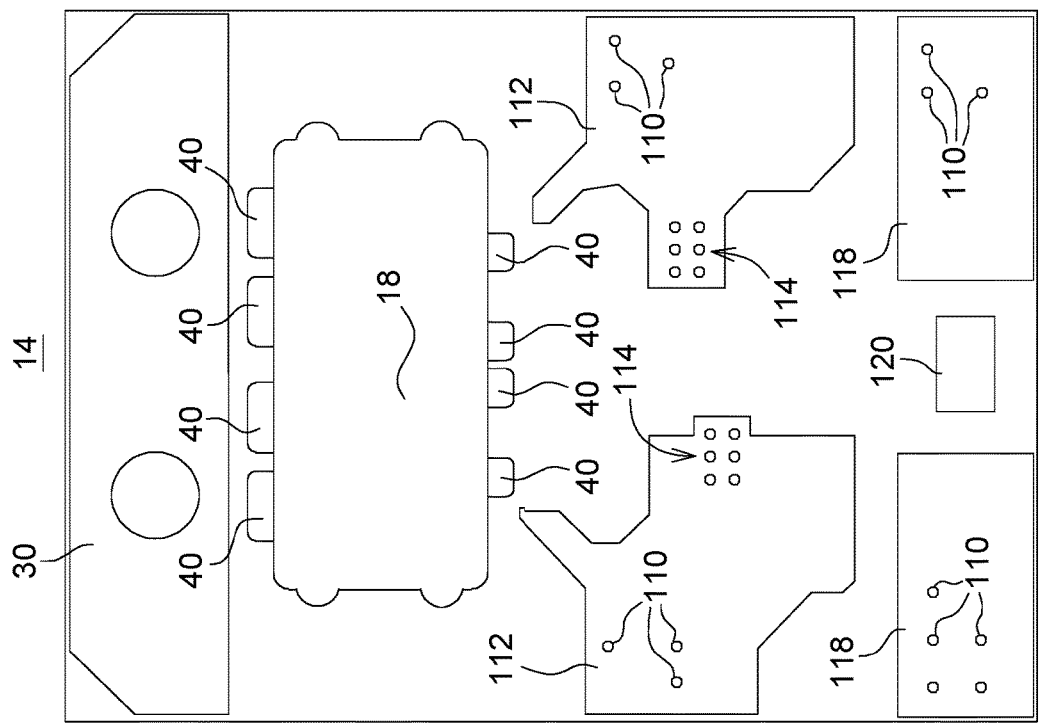
FIG. 1C is a plan view of an inner layer or third layer of a circuit board in accordance with one embodiment.

As used herein, the top layer 11 and the bottom layer 16 of the circuit board 30 represent outer layers 28 of the circuit board 30. In accordance with one embodiment, an electronic assembly comprises a gate drive module 10 comprising multiple circuit board 30 layers are sandwiched (e.g., electrically and mechanically connected) together. Each layer has a central opening 18 that is aligned with the other layers (e.g., 11, 12, 13, 14, 15 and 16). A switching circuit chipset 20 (in FIG. 5) is positioned in the central opening 18. The switching circuit chipset 20 has a plurality of lead frames 22 (in FIG. 5) for providing electrical connections to the switching circuit chipset 20 (e.g., without any wire bonds). The lead frames (22, 122, 222, 322) are alignable (e.g., aligned, registered or self-aligned by continuous or discontinuous contact or engagement) with pockets 24 in two or more of the layers (e.g., the first layer 11 and the second layer 12) to facilitate alignment (e.g., during manufacturing and prior to soldering in a reflow oven in one or more passes) of the contact portions of the lead frames (22, 122, 222, 322) with corresponding conductive pads 26 (in FIG. 3) on an outer layer 28 of the circuit board 30.

Figure 3:
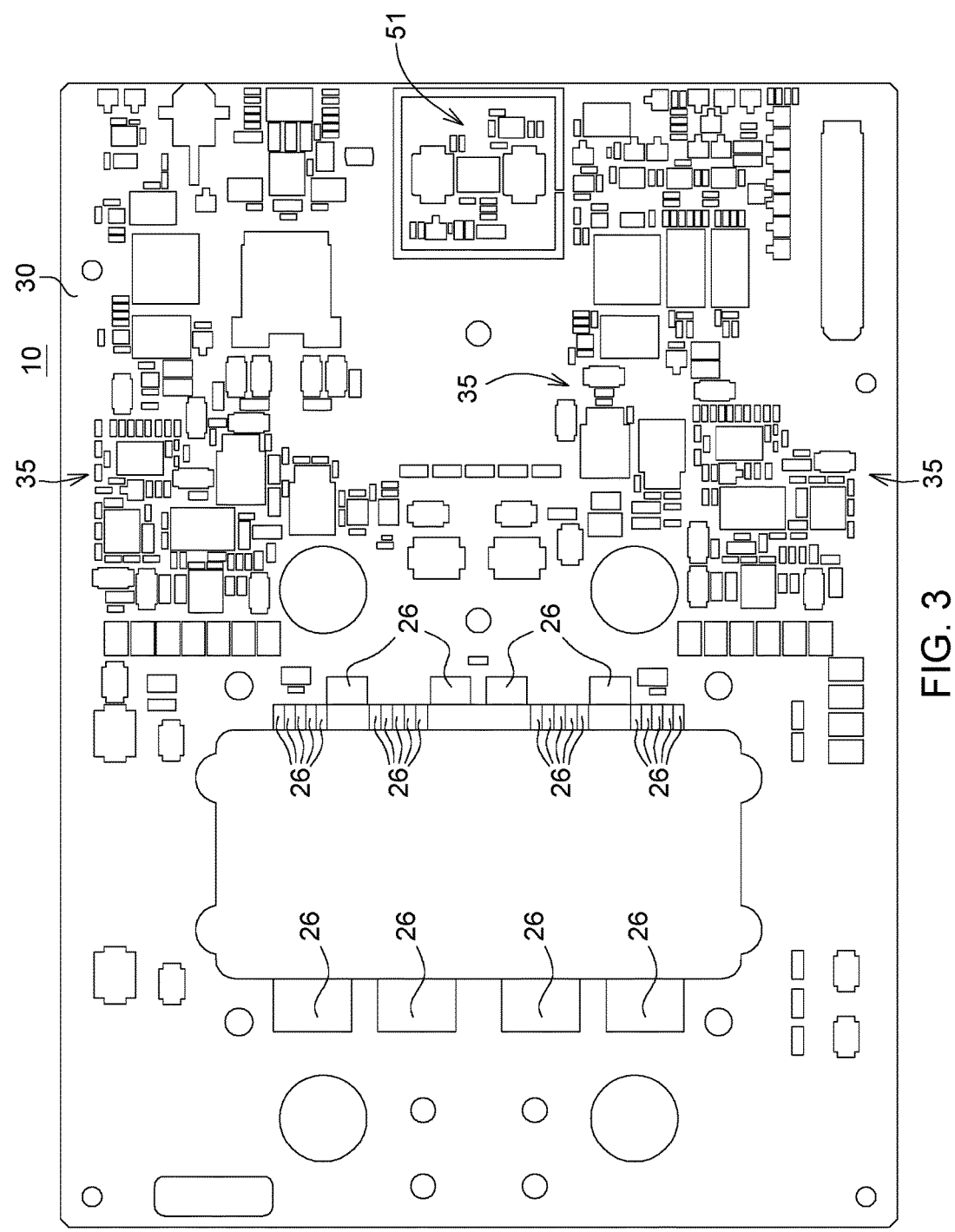
FIG. 3 is top side or outer side of the circuit board, consistent with FIG. 1A through FIG. 1F, inclusive, and populated with components for driver control circuitry.

FIG. 1A through FIG. 1F, inclusive, illustrate the circuit board 30 for a gate drive module 10 of FIG. 3. The gate driver module provides control signals for turning off and on the semiconductors of the switching circuit chipset 20 to achieve a desired control of a motor, generator or electrical device. For example, the gate driver module 10 may provide pulse-width modulated signal (e.g., space vector pulse-width 46 modulated signal) to the switching circuit chipset 20.

FIG. 1A is a plan view of at top side 27 or first layer 11 of a circuit board 30 for the gate driver module 10 in accordance with one embodiment. The edge near the central opening 18 has alignment pockets 24 or cut-outs that match or coincide with the shape and size of the lead frames 22 for alignment or registration of the lead frames 22 and associated switching circuit chipset 20 with the conductive pads 26 on the circuit board 30. These pockets 24 force alignment of the lead frames 22 of switching circuit chipset 20, and the associated terminals of the power switching semiconductors, such as transistors, insulated gate bipolar junction transistors, and other transistors with corresponding conductive pads 26 for a mechanical and electrical connection (e.g., via soldering). The top side 27 or outer layer 28 of the circuit board 30 has conductive pads 26 that mate with one or more lead frames 22. In one embodiment, the conductive pads 26 are actually formed on inner layers (e.g., layers 13, 14, and/or 15) of the circuit board 30 that align with corresponding openings or portions of alignment pockets 24 in the first layer 11 and the second layer 12 of the circuit board 30, for example.

In FIG. 1A, the top side 27 or first layer 11 of a circuit board 30 comprises a plurality of conductive traces (102, 104), where the conductive traces (102, 204) can terminate in one or more conductive pads 106, conductive vias, or metal plated through-holes. Further, a plurality of electrical or electronic components 35 can be aligned with corresponding conductive pads 106 and mounted (e.g., soldered) on the top side 27 or first layer of the circuit board 30. In one example, electronic component 35, such as a semiconductor chip, can be mounted on an array of respective conductive pads 108.

In certain embodiments, a metallic ground plane region 116 may be interrupted to define a dielectric region 115 or dielectric island to isolate electrically the conductive pads (106, 108) and associated conductive traces 102 from the metallic ground plane region 116. Within the dielectric region 115, an array of conductive pads 108 can be positioned to receive a corresponding electronic component 35. Similarly, within the dielectric region 115 one or more conductive traces 102 can terminate in one or more conductive pads 106, conductive vias or metal-plated through-holes. As illustrated, an array of conductive pads 108 may receive a corresponding electronic component 35 (in FIG. 3). In one embodiment, the electronic components 35 are arranged in circuits, such as control circuit for driving or controlling input terminals (e.g., gate or base terminals) of the switching circuit chipset 20 (e.g., power semiconductors or power transistors) that are mounted in the central opening 18.

FIG. 1B is a plan view of an inner layer or second layer 12 of a circuit board 30 in accordance with one embodiment. The edge near the central opening 18 has alignment pockets 24 or cutouts that match or coincide with the shape and size of the lead frames 22 for alignment or registration of the lead frames 22 and associated switching circuit chipset 20 with the conductive pads 26 on the circuit board 30. These pockets 24 force alignment of the lead frames 22 of switching circuit chipset 20, and the associated terminals of the power switching semiconductors, such as transistors, insulated gate bipolar junction transistors, and other transistors.

In FIG. 1 B, the inner layer or second layer 12 of a circuit board 30 comprises one or more metallic ground plane regions (112, 116). As illustrated, the metallic ground plane regions (112, 116) comprise conductive vias 114, metal-plated through holes 110, or both. For example, the metallic ground plane regions 112 have conductive vias 114 (e.g., an array of conductive vias 114) that terminate in conductive pads (at the outer surface of the second layer 12) that are electrically and mechanically connectable to other layers of the circuit board via conductive adhesive, solder, compressive contact, or another mechanism. Similarly, the metal-plated through holes 110 of multiple or different layers (e.g., first layer 11 and second layer 12) of the circuit board may align or register with each other to allow conductors or electrical leads to pass through multiple layers of the circuit board 30, or to form an integral electrical and mechanical connection between metal-plated through holes 110 associated with multiple layers of the circuit board 30.

FIG. 1C is a plan view of an inner layer or third layer 13 of a circuit board 30 in accordance with one embodiment. The circuit board 30 close to the central opening 18 has copper coin 40, heavy copper pour, thick copper traces, thick copper alloy traces, or conductive traces that pass-through or interconnect with the conductive pads 26, which are accessible via the top side 27 of the circuit board 30. As used herein, copper coin 40 refers to conductive traces or thick pads (e.g., approximately 0.080 inches thick or 0.2 centimeters thick) on one or more circuit board layers, where the copper coin 40 are composed of copper or copper alloy that communicate with or align with two or more layers of the circuit board 30. On the top side of the circuit board 30, the conductive pads 26 mate with the lead frames 22 and the conductive pads 26 are associated with pass-through metallization that is connected to circuit traces on a bottom side 29 of the circuit board 30.

For example, the circuit traces on the bottom side 29 of the circuit board 30 comprises a set of direct current traces 32, and an output trace 34. Further in some configurations, bus bars are electrically and mechanically connected to the direct current traces 32 and one or more output trace(s) 34 to increase the height of the conductor, to increase thermal conductivity and to increase electrical conductivity. As illustrated, the copper coins, heavy copper pour, or one or more copper metal layers can occupy a portion of the alignment pockets 24 or cutouts to provide a pass-through electrical connection through multiple layers of the circuit board 30. In one embodiment, the pass-through electrical connection supports electrical connections between a top side 27 and bottom side 29 of the circuit board 30 for the direct current bus terminals 33 and the alternating current output terminal 31.

In FIG. 1C, the inner layer or third layer 13 of a circuit board 30 has metallic ground plane regions (112, 116) that are similar to metallic ground plane regions of FIG. 1B, except the metallic ground plane region (112, 116) has one more dielectric regions 115 to isolate conductive traces 102 and associated conductive pads 110 or terminals from the metallic ground plane region 116. Like references in FIG. 1A through 1F, indicate like elements or features.

Figure 1D:
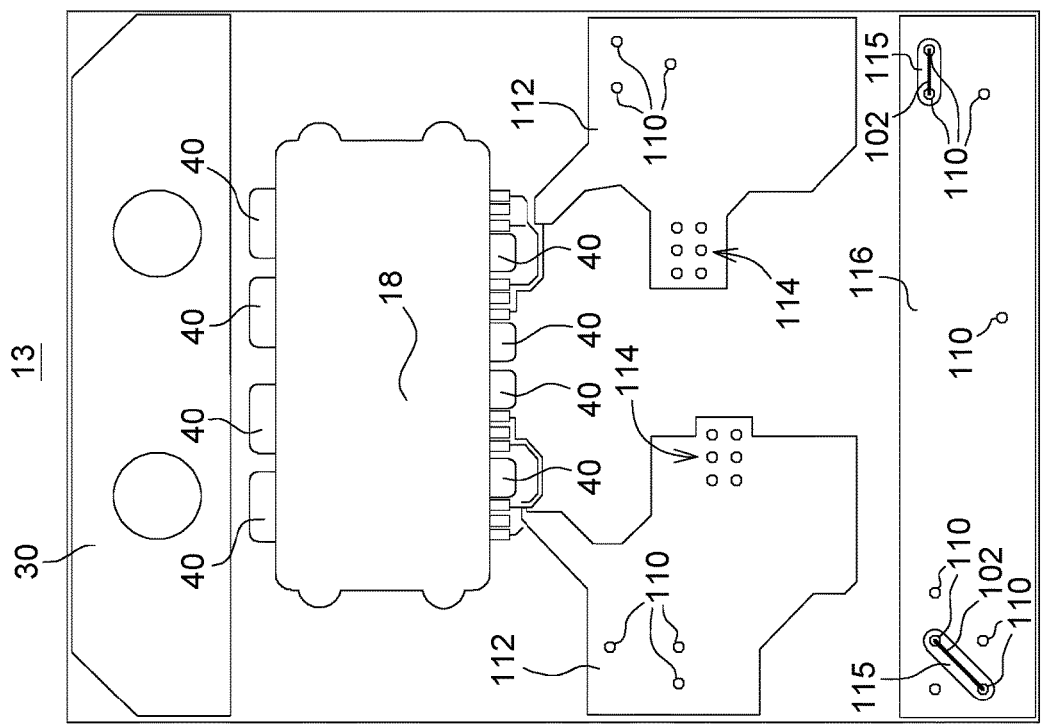
FIG. 1D is a plan view of an inner layer or fourth layer of a circuit board in accordance with one embodiment.

FIG. 1D is a plan view of an inner layer or fourth layer 14 of a circuit board 30 in accordance with one embodiment. The circuit board 30 close to the central opening 18 has copper coin 40, heavy copper pour, or conductive traces that pass-through or interconnect the conductive pads 26 that mate with the lead frames 22 with corresponding circuit traces on a bottom side 29 of the circuit board 30. For example, the circuit traces on the bottom side 29 of the circuit board 30 comprises a set of direct current traces 32, and an output trace 34. Further in some configurations, bus bars (e.g., 64, 66, 68) are electrically and mechanically connected to the direct current traces 32 and one or more output trace(s) 34 to increase the height of the conductor, to increase thermal conductivity and to increase electrical conductivity. As illustrated, the copper coins 40, heavy copper pour, or one or more copper metal layers can occupy a portion of the alignment pockets 24 or cutouts to provide a pass-through electrical connection through multiple layers of the circuit board 30. In one embodiment, the pass-through electrical connection supports electrical connections between a top side 27 and bottom side 29 of the circuit board 30 for the direct current bus terminals 33 and the alternating current output terminal 31. Further, the secondary copper coins 120, heavy copper pour, or one or more copper metal layers can provide a secondary pass-through electrical connection through multiple layers of the circuit board 30. As illustrated, the copper coins 120 define a substantially rectangular region, although other geometric shapes can be used.

In FIG. 1D, the inner layer or fourth layer 14 of a circuit board 30 comprises one or more metallic ground plane regions (112, 118) that include metal-plated through holes 110 or metal-plated conductive vias 114 to provide electrical connections between multiple layers (e.g., first layer 11, second layer 12, third layer 13, and fourth layer 14) of circuit board 30 that support the formation of circuits and associated interconnection of electrical or electronic components 35.

Figure 1F:
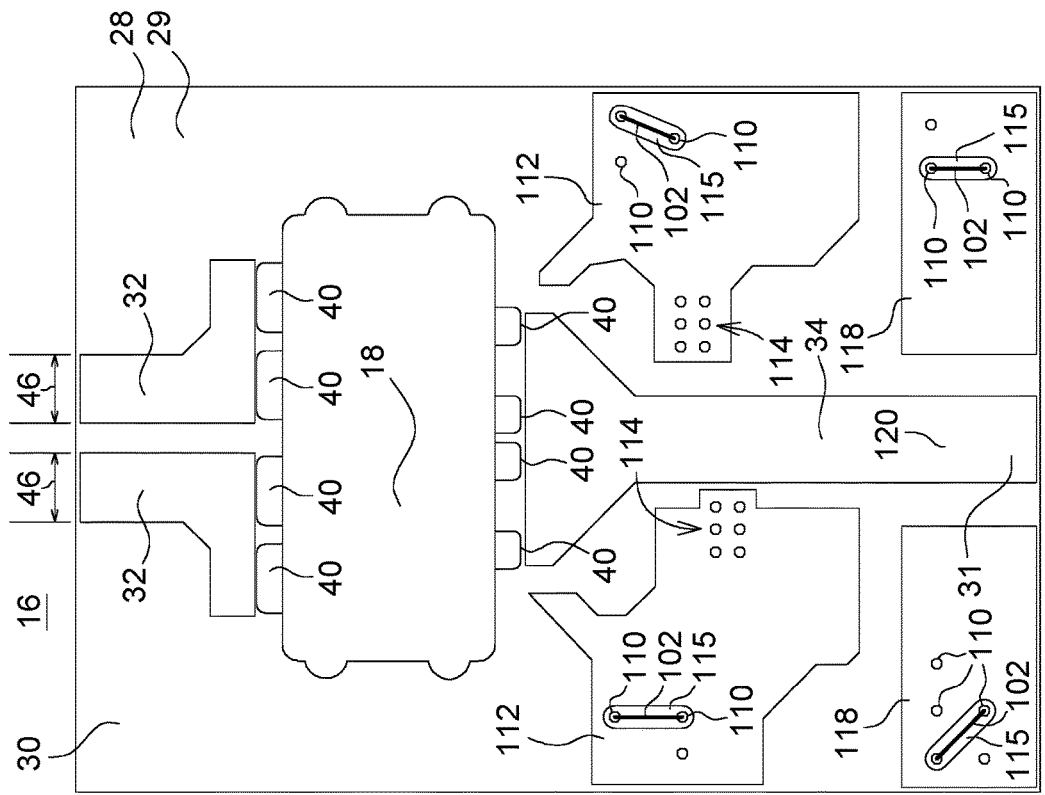
FIG. 1F is a plan view of a bottom layer or a sixth layer of a circuit board in accordance with one embodiment.
Figure 1E:
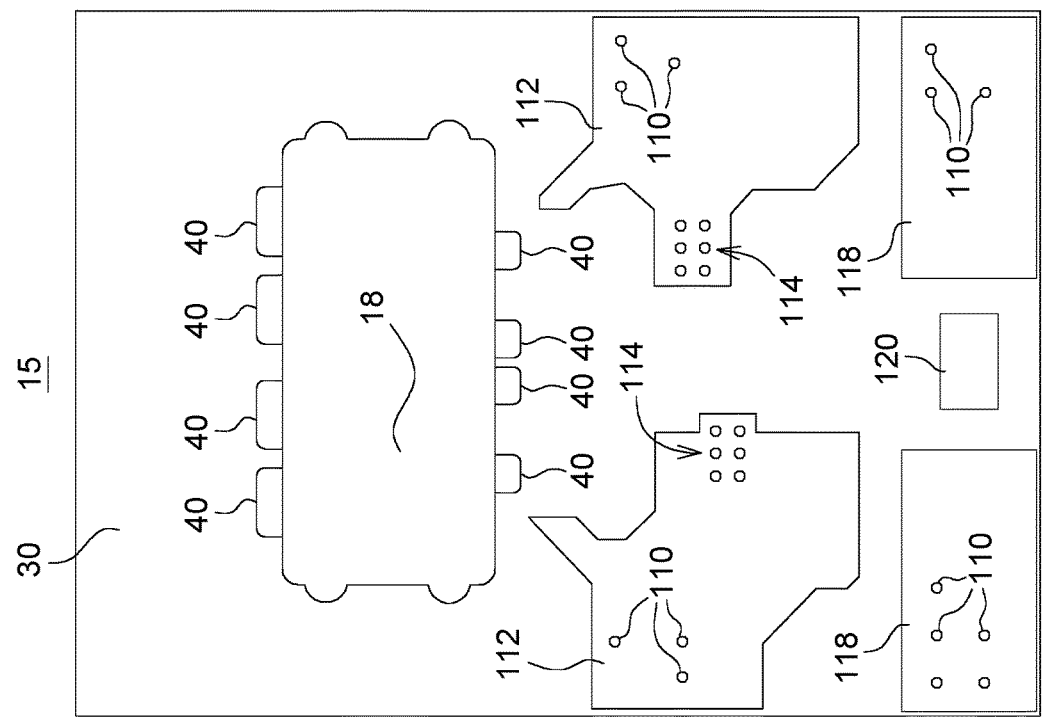
FIG. 1E is a plan view of an inner layer or a fifth layer of a circuit board in accordance with one embodiment.

FIG. 1E is a plan view of an inner layer or a fifth layer 15 of a circuit board 30 in accordance with one embodiment. Around a periphery 38 of the central opening 18, a plurality of copper coin 40, heavy copper pour, or a thick copper trace are deposited on adjacent layers of the multiple circuit board 30 layers to facilitate communication of direct current signals and/or alternating current signals between different board layers, and for heat dissipation. The plurality of copper coin 40 is associated with an inward portion 42 of the pockets 24 toward the switching circuit chip set 20.

In FIG. 1E, the inner layer or fifth layer 15 of a circuit board 30 comprises one or more metallic ground plane regions (112, 118) and the secondary copper coin 120 that are similar to those like-numbered features in FIG. 1D. Similarly, between the first layer 11, second layer 12, third layer 13, fourth layer 14 and fifth layer 15 of the circuit board 30, one or more metal-plated through holes 110 or metal-plated conductive vias 114 provide electrical connections between the multiple layers (11, 12, 13, 14 and 15) of circuit board 30 that support the formation of circuits and associated interconnection of electrical or electronic components 35.

FIG. 1F is a plan view of a bottom side 29 or a sixth layer 16 of a circuit board 30 in accordance with one embodiment. Copper coins 40, heavy copper pour or copper layers for direct current bus terminals and the alternating current out terminal become path for high current pass-through from top layer to bottom layer of the circuit board 30 for the gate driver module. The set of traces for the direct current bus, and the alternating current output bus can be plated to support attachment (e.g., soldering, brazing or welding to produce a mechanical and electrical connection) of corresponding direct current bus bars and an alternating current bus bar.

In FIG. 1F, a set of direct current traces 32 are made, etched, deposited or otherwise formed on a bottom layer (e.g., sixth layer 16) or the circuit board 30 or on an outer layer 28 of the circuit board 30 for supplying direct current to the switching circuit chipset 20. An output trace 34 is made, etched, deposited or otherwise formed on the bottom layer or an outer layer 28 of circuit board 30 layer for outputting an alternating current phase output signal. The set of direct current traces 32 have a width 46 that is greater than a thickness or a height of the direct current traces 32. The output trace 34 has a width 46 that is greater than a thickness or a height of the output trace 34.

In FIG. 1F, the bottom side 29 or sixth layer 16 of the circuit board 30 is similar to the fifth layer 15 of the circuit board 15 of FIG. 1E, except the metallic ground plane regions (112, 118) are interrupted by corresponding dielectric regions 115 or dielectric islands that isolate electrically one or more conductive traces 102, conductive pads, metal-plated through-holes 110, or conductive vias from the metallic ground plane region (112, 118) of the sixth layer 16 of the circuit board 30.

In one configuration, the driver module of FIG. 1A through FIG. 1F, inclusive, eliminates the need for a wiring harness (e.g., ribbon cable and associated connectors) for the current sensor and any bolted joint on the alternating current terminal of the inverter.

Figure 2:
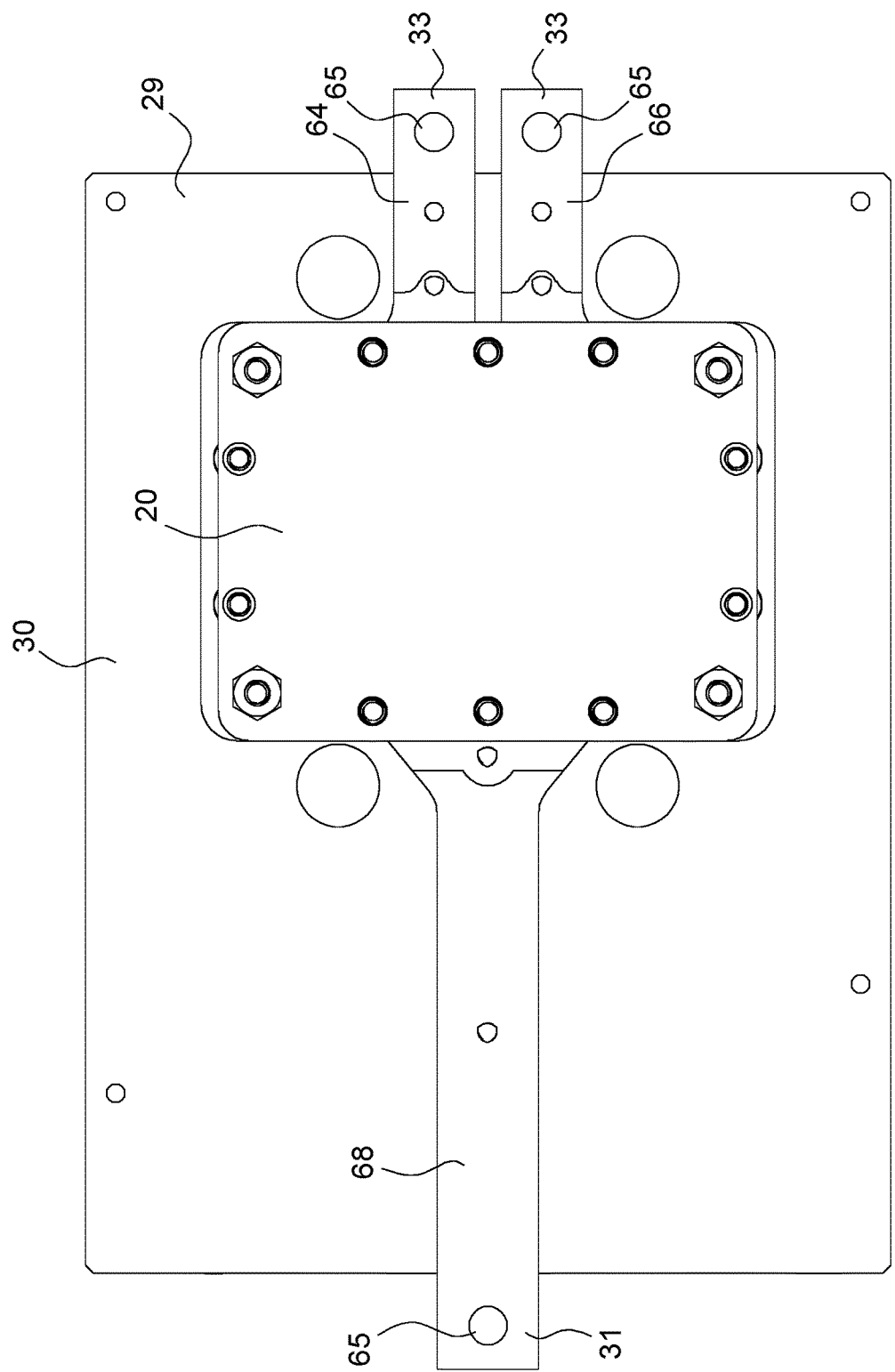
FIG. 2 is a bottom side or an outer side of the circuit board, consistent with FIG. 1A through FIG. 1F, inclusive.

FIG. 2 is a bottom side 29 or an outer side of the circuit board 30, consistent with FIG. 1A through FIG. 1F, inclusive. In FIG. 2, the first bus bar 64 and the second bus bar 66 overly the set of the direct current traces 32. The first bus bar 64 and the second bus bar 66 are electrically and mechanically coupled (e.g., soldered) to the set of the direct current traces 32. The first bus bar 64 and the second bus bar 66 may be collectively referred to as the direct current bus bar. The third bus bar 68 overlies the output trace 34. The third bus bar 68 is electrically and mechanically coupled (e.g., soldered) to the output trace 34.

In one configuration, a first bus bar 64 terminates with a bore in the bus bar, where the first bus bar 64 longer than each one of the direct current traces 32. As illustrated in FIG. 2, the first bus bar 64 overhangs an edge of the circuit board 30. A second bus bar 66 terminates with a bore in the bus bar, where the second bus bar 66 is longer than each one of the direct current traces 32. The second bus bar 66 overhangs the edge of the circuit board 30.

In one configuration, a third bus bar 68 terminates in a bore. The third bus bar 68 is longer than the output trace 34. As illustrated in FIG. 2, the third bus bar 68 overhangs the edge of the circuit board 30. The third bus bar 68 may also be referred to as an alternating current bus bar.

Figure 4:
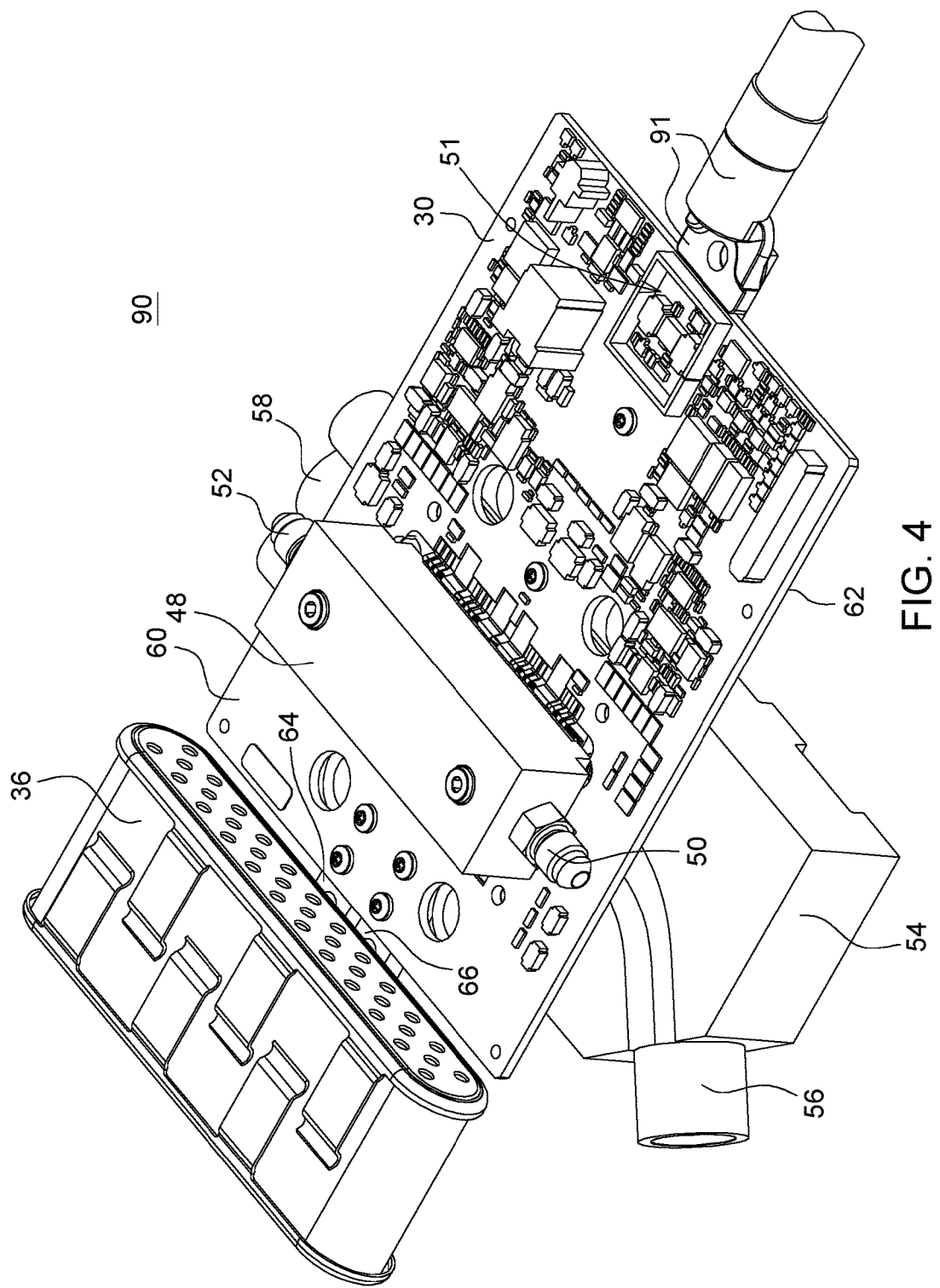
FIG. 4 is a perspective view of one embodiment of an electronic assembly that features a capacitor across the direct current bus terminals and an alternating current output terminal, where coolant chambers are featured above and below the circuit board.

Because of the substantially planar structure of first bus bar 64, the second bus bar 66 and third bus bar 68 (e.g., AC and DC power bus bars), advanced thermal management of these bus bar can be developed, via coolant chambers (e.g., 48, 54), because the planar structure of these bus-bars is suitable for direct interface of cooling systems, such as the coolant chambers illustrated in FIG. 4. Active cooling of DC and AC bus bars becomes possible because of the planar bus bars can be mated with corresponding recesses in the coolant chambers, the circuit board 30 or both. In certain configurations, active cooling is well suited to increase peak power capability of inverter by reducing of hot-spots due to rapid withdrawal of heat from planar surface of AC and DC bus bars (64, 66, 68). Accordingly, the electronic assembly or inverter can be operated with enhanced longevity for greater number of power cycles as compared to inverters that are not actively cooled.

In one embodiment, the second chamber 54 for coolant has a first inlet 50 and a first outlet 52. The second chamber 54 overlies, with a dielectric barrier, the first bus bar 64 and the second bus bar 66 for heat dissipation. In another configuration, the second chamber 54 overlies, with a dielectric barrier, the third bus bar 68 for heat dissipation.

In an alternate embodiment, the second chamber 54 may be composed of a dielectric material, such as plastic, polymer, a fiber-filled plastic, a fiber-filled polymer and filler in a resin matrix, or the like to obviate the need for the dielectric barrier.

FIG. 3 is top side or outer side of the circuit board 30, consistent with FIG. 1A through FIG. 1F, inclusive, and populated with components 35 for driver control circuitry of the gate drive module 10 for controlling or driving the switching circuit chipset 20 with a suitable signal, such as a pulse-width modulation signal for controlling an electric machine, motor or generator coupled to terminals of the electronic assembly. A current sensor 51 populates a top layer of the circuit board 30 to measure or detect observed current or associated electromagnetic flux produced by alternating current bus bar 68 attached to the alternating circuit trace 34 on bottom side 29 or outer layer of the circuit board 30.

Via one or more lead frames 22 (in FIG. 5) that are connected to corresponding conductive pads 26 on an outer layer 28 of the circuit board 30, the direct current (DC) and alternating current (AC) power terminals of the switching circuit chipsets 20 (e.g., power semiconductor) are connected with direct current bus bars (64, 66) and an alternating current output bus 68 bar electrically and mechanically connected (e.g., embedded) to the circuit board 30.

FIG. 4 is a perspective view of an electronic assembly 90 that features a capacitor 36 across the direct current bus terminals and an alternating current output terminal. For example, the set of direct current traces 32 are coupled to capacitor 36 for filtering the direct current signal.

FIG. 4 features coolant chambers (48, 54) above and below the circuit board 30. In FIG. 4, the first chamber 48 for coolant has a first inlet 50 and a first outlet 52, the first chamber 48 overlying a first side 60 (e.g., upper side) of the switching circuit chipset 20 or the first side 60 of the circuit board 30. The second chamber 54 for coolant has a second inlet 56 and second outlet 58, the second chamber 54 overlying a second side 62 of the switching circuit chipset 20, the second side 62 of the switching circuit chipset 20 opposite the first side 60.

In an alternate embodiment, a second chamber 54 for coolant has a second inlet 56 and second outlet 58. The second chamber 54 overlies a second side 62 of the switching circuit chipset 20, at least a portion of the direct current traces 32 and at least a portion of the output trace 34, the second side 62 (e.g., lower side) of the switching circuit chipset 20 opposite the first side 60. The second side 62 may also refer to the second side 62 (e.g., lower side) of the circuit board 30. Accordingly, direct cooling, with circulated coolant, of the output trade and direct current traces 32 is possible.

In accordance with one embodiment, tubing is used to interconnect the first inlet 50 and first outlet 52 to a pump to circulate coolant and a radiator to dissipate heat from the circulated coolant, wherein the coolant comprises engine coolant associated with an internal combustion engine operating at a temperature approximately at or below 120 degrees Celsius. In accordance with another embodiment, tubing is used to interconnect the second inlet 56 and second outlet 58 to a pump to circulate coolant and a radiator to dissipate heat from the circulated coolant, wherein the coolant comprises engine coolant associated with an internal combustion engine operating at a temperature approximately at or below 120 degrees Celsius.

The electronic assembly 90 may comprise an inverter power stage that uses an advanced manufacturing method, where the pockets 24 near a central opening 18 of the circuit board 30 in conjunction with the associated lead frames 22 facilitate alignment or registration of the switching circuit chipset 20 with its electrical connections on the circuit board 30. The electronic assembly can be made or constructed during vacuum based vapor-phase soldering method of inverter component. The vacuum based vapor-phase soldering method will require pick-and-placement robotic arms to place parts in the heat sink and ceramic substrate. The electronic assembly has unique packaging advantages, such as high power density, and lends itself to advanced and high-performance thermal management with engine coolant of an internal combustion engine for vehicle applications with engine temperature coolant equal to or lower than approximately 120 Degrees Celsius.

In one embodiment, the semiconductors or semiconductor chipset of the switching circuit chipset 20 may comprise silicon insulated gate bipolar transistors (IGBTs), Silicon Carbide (SiC) metal oxide semiconductor (MOSFETs), silicon diodes, Schottky diodes, or other semiconductor devices.

Figure 5:
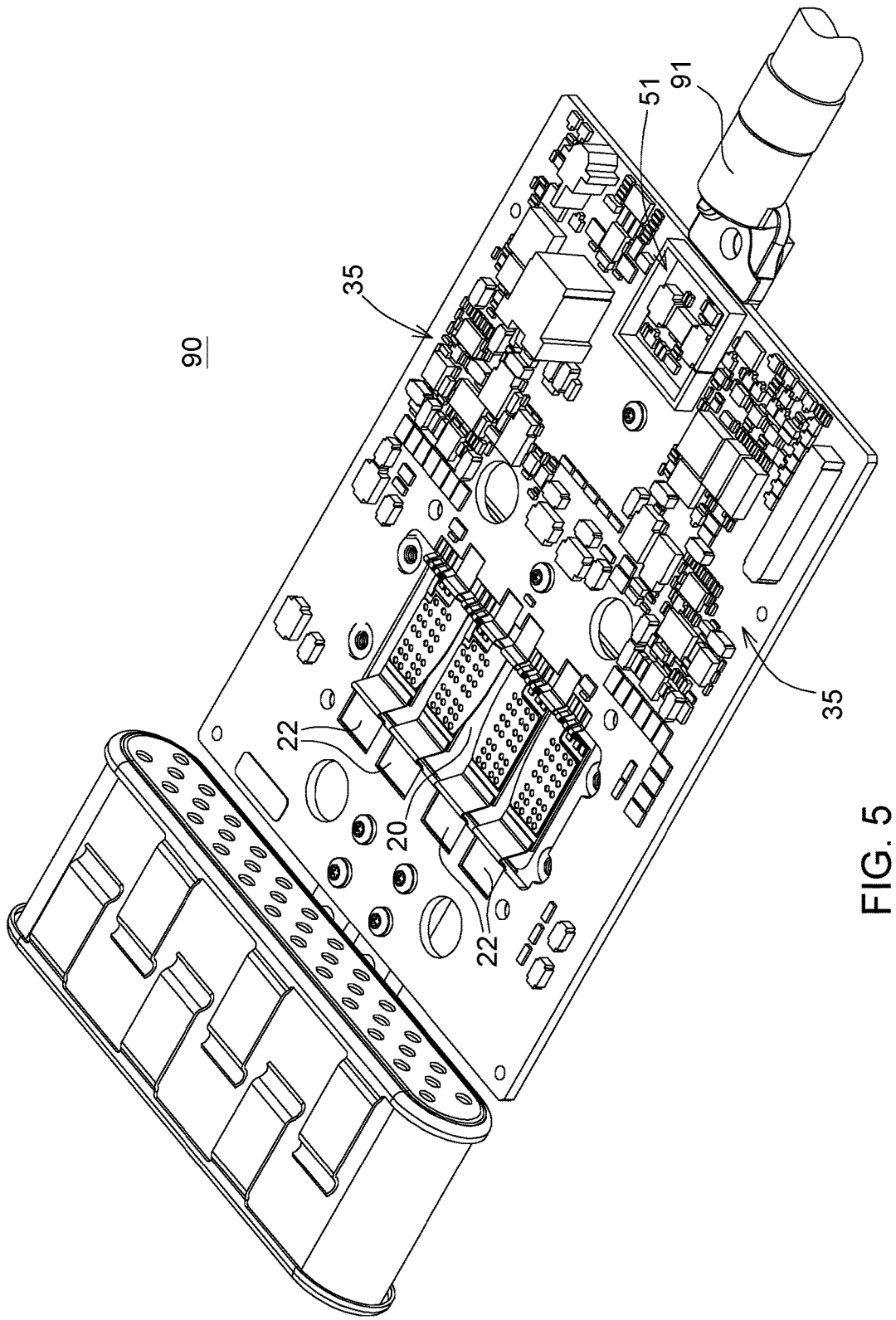
FIG. 5 is a perspective view of another embodiment of an electronic assembly that features a capacitor across the direct current bus terminals and an alternating current output terminal.

FIG. 5 is a perspective view of another embodiment of an electronic assembly 90 that features a capacitor 36 across the direct current bus terminals and an alternating current output terminal. In one embodiment, the circuit board 30 supports a gate drive module 10 provides electrical control signals for the semiconductors with the switching circuit chipset 20. For example, the switching circuit chipset 20 comprises a high-side switching semiconductor device and low-side switching semiconductor device for each phase of an inverter.

In FIG. 4 and FIG. 5, the electronic assembly 90 does not require any bolted joints. In one embodiment, the circuit board 30 requires as few as one connector to interface the electronic assembly 90, such as an inverter power stage with control board for low-voltage signaling. The low-voltage signaling can include signals that are PWM (pulse width module) gate drive signal, inverter protection watch-dog circuit signals, such as de-saturation, current sense signal, temperature sense signals, among other signals.

In one embodiment, the electronic assembly 90 features active cooling of AC output connector 91 that can be accomplished by using an additional coolant chamber with an input port and an output port for circulating coolant. In one configuration, the active cooling of the AC output connector can facilitate miniaturization of inverter power stage. In another configuration, the active cooling of the AC output connector tends to increase longevity and reliability of inverter.

The circuit board 30 comprises a gate drive module 10 with an integral or built-in current sensor and shielding of electromagnetic current sensor 51, such as an electromagnetic field sensor, where the current sensor 51 is used at the phase output of one alternating current output phase of an inverter, for example. Accordingly, the integral or built-in current sensor eliminates need for a separate sensing circuit because the current sensing can become part of the circuit board 30 (e.g., circuit board for the gate driver module 10) manufactured during single-pass method through vacuum vapor phase machine.

Figure 6:
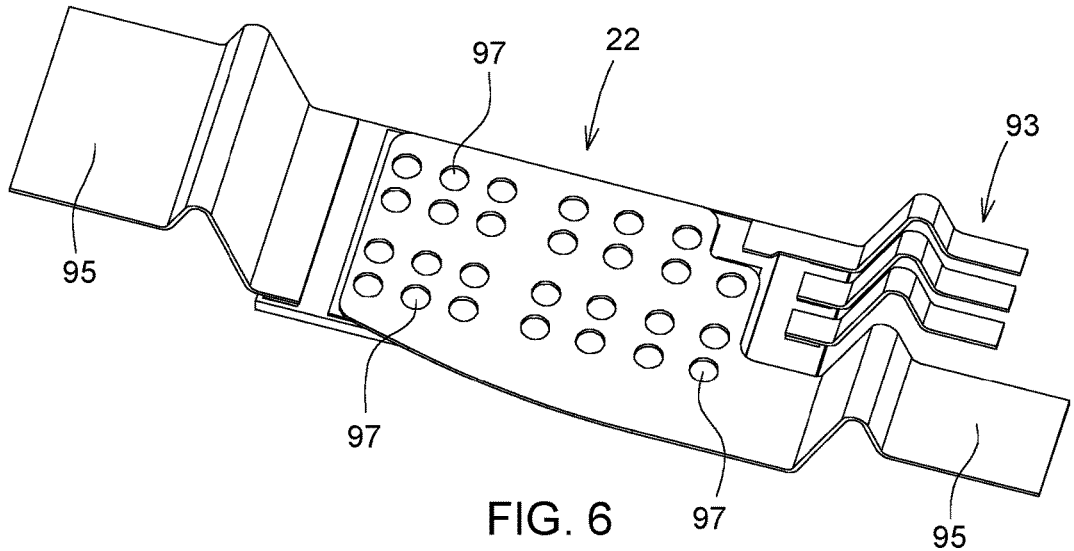
FIG. 6 is a perspective view of one embodiment of a lead frame.

FIG. 6 is a perspective view of one embodiment of a lead frame 22. In one embodiment, the power semiconductor chipset use lead frames 22 for enhanced thermal dissipation. In a first example, the lead frames 22 may be made from conductive sheet metal or alloys. In a second example, the lead frames 22 may be made from 20 micron to 50 micron thin cooper sheet with desired x-y dimensions and shape to match shape of active semiconductor in chipset. In a third example, the lead frame composed of copper or a copper alloy will be used as carrier of high-mobility electrons from semiconductor to power terminals of the power semiconductor chipsets.

Each lead frame 22 may be associated with switched terminals 95 of semiconductor devices or semiconductor switches of the switching circuit chipset 20. Further, each lead frame 22 is associated with one or more control terminals for controlling, activating or deactivating the semiconductor devices or semiconductor switches of the switching circuit chipset 20. The terminals (93, 95) are connected to, mated with or soldered to the corresponding conductive pads 26 on the circuit board; where the openings (e.g., weep holes) allow excess solder to escape for a sound solder joint.

Figure 7:
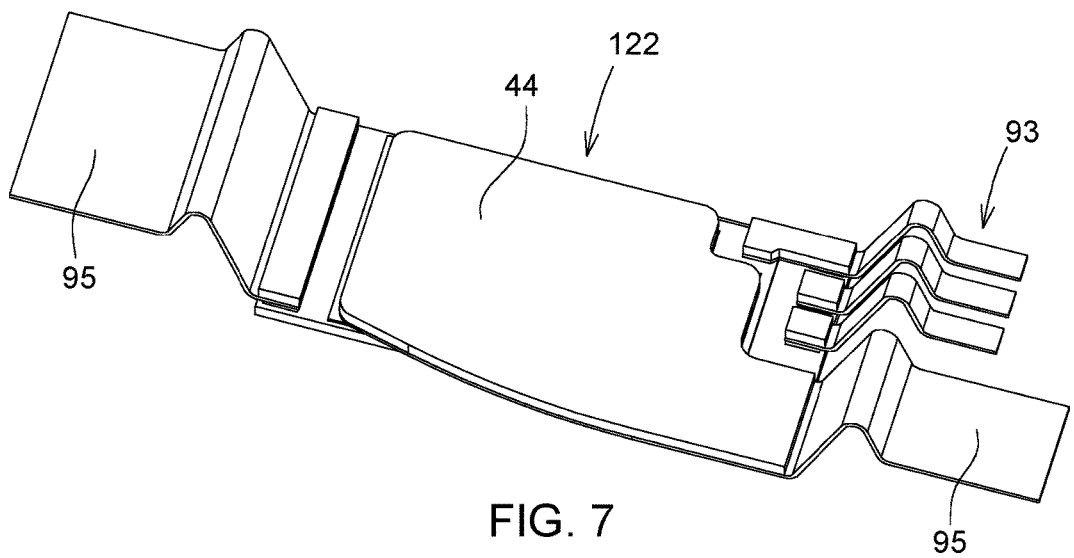
FIG. 7 is a perspective view of another embodiment of a lead frame of FIG. 6 with a thermal management coating layer (e.g., graphene coating).

FIG. 7 is a perspective view of another embodiment of a lead frame 122 of FIG. 6 with a thermal management coating layer, such as a graphene film or graphene layer 44. In a first example, the lead frame 122 may be formed, stamped, cut or made of sheet copper or copper foil that is approximately 50 microns thick. In a second example, the lead frame 122 or metal carrier may be coated with a thermal management coating, such as graphene film or graphene layer 44. In a third example, the lead frame 122 may be coated with graphene film or graphene layer 44 to ensure high thermal conductivity and high electrical conductivity. In one embodiment, the lead frame illustrated in FIG. 6 or FIG. 7 can be used for a high-side switching semiconductor device in the power chipset module.

Figure 8:
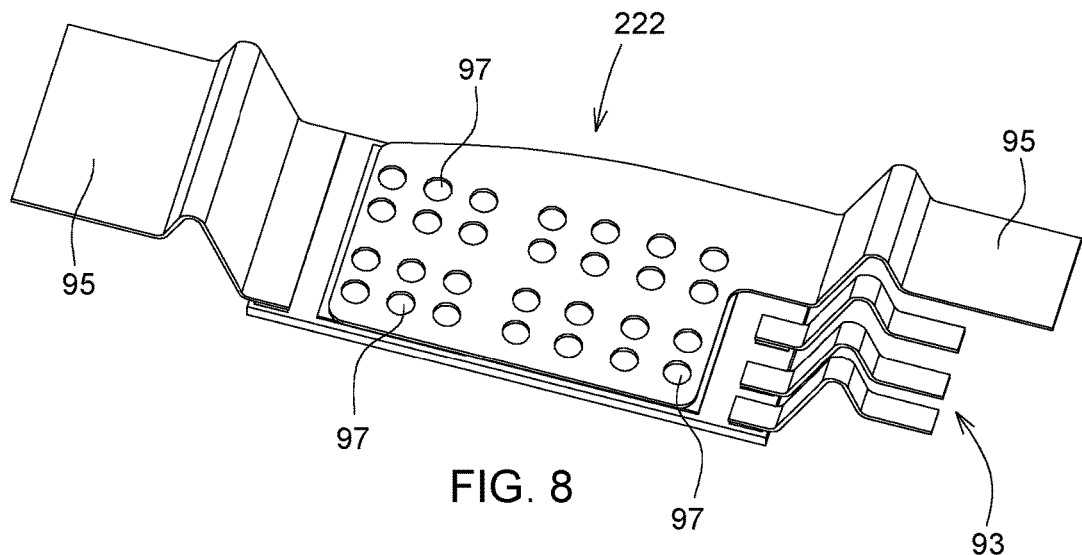
FIG. 8 is a perspective view of one embodiment of a lead frame.

FIG. 8 is a perspective view of one embodiment of a lead frame 222. In a first example, the lead frames 222 may be made from conductive sheet metal or alloys. In a second example, the lead frames 222 may be made from 20 micron to 50 micron thin cooper sheet with desired x-y dimensions and shape to match shape of active semiconductor in chipset. In a third example, the lead frame composed of copper or a copper alloy will be used as carrier of high-mobility electrons from semiconductor to power terminals of the power semiconductor chipsets.

Each lead frame 222 may be associated with switched terminals 95 of semiconductor devices or semiconductor switches of the switching circuit chipset 20. Further, each lead frame 222 is associated with one or more control terminals for controlling, activating or deactivating the semiconductor devices or semiconductor switches of the switching circuit chipset 20. The terminals (93, 95) are connected to, mated with or soldered to the corresponding conductive pads 26 on the circuit board; where the openings (e.g., weep holes) allow excess solder to escape for a sound solder joint.

Figure 9:
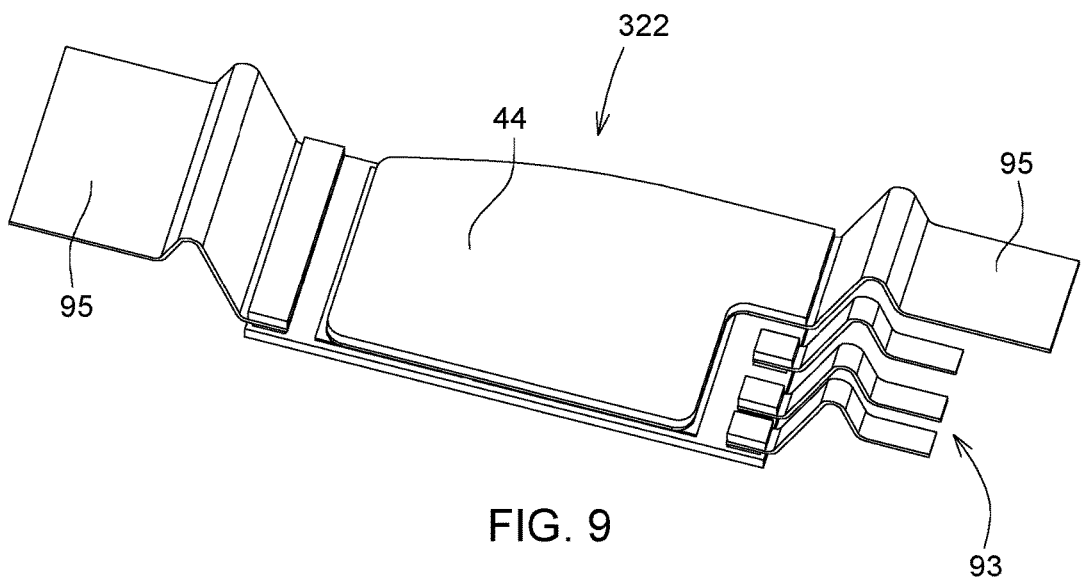
FIG. 9 is a perspective view of another embodiment of a lead frame of FIG. 8 with a thermal management coasting layer (e.g., graphene coating).

FIG. 9 is a perspective view of another embodiment of a lead frame 322 of FIG. 8 with a thermal management coating layer, such as a graphene film or graphene layer 44 coating. In a first example, the lead frame may be formed, stamped, cut or made of sheet copper or copper foil that is approximately 50 microns thick. In a second example, the lead frame or metal carrier may be coated with a thermal management coating, such as graphene film or graphene layer 44. In a third example, the lead frame may be coated with graphene film or graphene layer 44 to ensure high thermal conductivity and high electrical conductivity. In one embodiment, the lead frame illustrated in FIG. 6 or FIG. 7 can be used for a low-side switching semiconductor device in the power chipset module. Any of the lead frames (22, 122, 222, 322) can be used interchangeably in any of the embodiments set forth in this document; however, those lead frames (122, 322) with graphene coating 44 are well-suited for enhanced thermal dissipation and electrical conductivity.

The electronic assembly may include an inverter power stage that can be fabricated by a single assembly in a single pass-through vapor-phase reflow process. In one configuration, the electronic assembly comprises a gate drive circuit board 30, semiconductor power module, a current sensor, alternating current (AC) bus bar, direct current (DC) bus bars, and alternating current connector, among other things. The electronic assembly is well suited for inverters that eliminate the need for bolted joints and reduces number of interconnect conductors within inverter, hence, promote reliability and longevity of the electronic assembly. Further, the electronic assembly facilitates design high power density because of high-performance thermal management, including features such as an inverter that is engine coolant capable, where engine coolant is used to cool both the internal combustion engine and the electronic assembly via coolant chambers (e.g., that operate at about 115 degrees Celsius).

If the electronic assembly is an inverter, the inverter can be manufactured using single pass manufacturing of inverter power stage manufactured by use of vapor phase method. For example, the components of power stage that can be manufactured using single-pass include one or more of the following components: (a) double-sided cooled power semiconductor module (b) gate driver circuit board 30, (c) laminated DC bus bar, (d) interconnects for DC bus capacitor 36 module (e) AC bus bar (f) current sensor with shield, (g) AC output connector (h) connector for interface with control board (i) low-voltage electronics referenced to control board ground.

Having described one or more preferred embodiments, it will become apparent that various modifications can be made without departing from the scope of the invention as defined in the accompanying claims.

The following is claimed:

1. An electronic assembly comprising:
   a gate drive module comprising multiple circuit board layers sandwiched together, where each layer has a central opening that is aligned with the other layers;
   a switching circuit chipset in the central opening, the switching circuit chipset having a plurality of lead frames for providing electrical connections to the switching circuit chipset, the lead frames alignable with pockets in two or more of the layers to facilitate alignment of the contact portions of the lead frames with corresponding conductive pads on an outer layer of the circuit board;
   a set of direct current traces on an outer circuit board layer for supplying direct current to the switching circuit chipset; and
   an output trace on the outer circuit board layer for outputting an alternating current phase output signal.

2. The electronic assembly according to claim 1 wherein the set of direct current traces are coupled to capacitor for filtering the direct current signal.

3. The electronic assembly according to claim 1 further comprising:
   around a periphery of the central opening, a plurality of copper coin deposited on adjacent layers of the multiple circuit board layers to facilitate communication of direct current signals and/or alternating current signals between different board layers, and for heat dissipation.

4. The electronic assembly according to claim 3 wherein the plurality of copper coin is associated with an inward portion of the pockets toward the switching circuit chip set.

5. The electronic assembly according to claim 1 wherein the lead frames are coated with graphene film to enhance thermal conductivity and electrical conductivity.

6. The electronic assembly according to claim 1 wherein the gate drive module provides electrical control signals for transistors with the switching circuit chipset.

7. The electronic assembly according to claim 1 wherein the set of direct current traces have a width that is greater than a thickness or a height of the direct current traces.

8. The electronic assembly according to claim 1 wherein the output trace has a width that is greater than a thickness or a height of the output trace.

9. The electronic assembly according to claim 1 wherein a first chamber for coolant has a first inlet and a first outlet, the first chamber overlying a first side of the switching circuit chipset.

10. The electronic assembly according to claim 9 wherein a second chamber for coolant has a second inlet and second outlet, the second chamber overlying a second side of the switching circuit chipset, the second side of the switching circuit chipset opposite the first side.

11. The electronic assembly according to claim 9 wherein a second chamber for coolant has a second inlet and second outlet, the second chamber overlying a second side of the switching circuit chipset, at least a portion of the direct current traces and at least a portion of the output trace, the second side of the switching circuit chipset opposite the first side.

12. The electronic assembly according to claim 9 further comprising:
    tubing to interconnect the first inlet and first outlet to a pump to circulate coolant and a radiator to dissipate heat from the circulated coolant, wherein the coolant comprises engine coolant associated with an internal combustion engine operating at a temperature approximately at or below 120 degrees Celsius.

13. The electronic assembly according to claim 10 further comprising:
    tubing to interconnect the second inlet and second outlet to a pump to circulate coolant and a radiator to dissipate heat from the circulated coolant, wherein the coolant comprises engine coolant associated with an internal combustion engine operating at a temperature approximately at or below 120 degrees Celsius.

14. The electronic assembly according to claim 1 further comprising:
    a first bus bar terminating in a bore, the first bus bar longer than each one of the direct current traces;
    a second bus bar terminating in a bore, the second bus bar longer than each one of the direct current traces;
    the first bus bar and the second bus bar overlying and electrically and mechanically coupled to the set of the direct current traces.

15. The electronic assembly according to claim 14 further comprising:
    a third bus bar terminating in a bore, the third bus bar longer than the output trace; the third bus bar overlying the output trace and electrically and mechanically coupled to the output trace.

16. The electronic assembly according to claim 14 wherein a second chamber for coolant has a first inlet and a first outlet, the second chamber overlying, with a dielectric barrier, the first bus bar and the second bus bar for heat dissipation.

17. The electronic assembly according to claim 14 wherein a second chamber for coolant has a first inlet and a first outlet, the second chamber overlying, with a dielectric barrier, the third bus bar for heat dissipation.

* * * * *